United States Patent
Araki et al.

(10) Patent No.: US 11,178,784 B2
(45) Date of Patent: Nov. 16, 2021

(54) DISPLAY DEVICE

(71) Applicant: Sharp Kabushiki Kaisha, Sakai (JP)

(72) Inventors: Ryoh Araki, Sakai (JP); Tsuyoshi Kawaguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 28 days.

(21) Appl. No.: 16/620,621

(22) PCT Filed: Jun. 15, 2017

(86) PCT No.: PCT/JP2017/022151
§ 371 (c)(1),
(2) Date: Dec. 9, 2019

(87) PCT Pub. No.: WO2018/229941
PCT Pub. Date: Dec. 20, 2018

(65) Prior Publication Data
US 2021/0144871 A1     May 13, 2021

(51) Int. Cl.
*H05K 5/02*     (2006.01)
*H05K 5/00*     (2006.01)
(Continued)

(52) U.S. Cl.
CPC ........ *H05K 5/0226* (2013.01); *H01L 51/5253* (2013.01); *H05K 5/0017* (2013.01); *H01L 27/3244* (2013.01); *H01L 51/0097* (2013.01); *H01L 2227/323* (2013.01); *H01L 2227/326* (2013.01); *H01L 2251/5338* (2013.01)

(58) Field of Classification Search
CPC ............... H05K 5/0226; H05K 5/0017; H01L 51/5253; H01L 27/3244; H01L 51/0097; H01L 2227/323; H01L 2227/326; H01L 2251/5338; G06F 1/1681; G06F 1/1652; G09F 9/00; G09F 9/30
See application file for complete search history.

(56) References Cited

U.S. PATENT DOCUMENTS

2010/0232100 A1\* 9/2010 Fukuma ............ H04M 1/0216
361/679.01
2012/0307423 A1 12/2012 Bohn et al.
(Continued)

FOREIGN PATENT DOCUMENTS

JP     2002-270007 A     9/2002
JP     2014-519626 A     8/2014
(Continued)

OTHER PUBLICATIONS

Official Communication issued in International Patent Application No. PCT/JP2017/022151, dated Sep. 12, 2017.

*Primary Examiner* — Abhishek M Rathod
(74) *Attorney, Agent, or Firm* — Keating & Bennett, LLP

(57) ABSTRACT

Provided is a display device in which a housing includes a plurality of support parts and a bending part. At least two of the plurality of support parts are coupled via the bending part. A display unit is fixed to the plurality of support parts. The bending part is at least capable of bending with the display unit as an inner side. In a case where the bending part is bent with the display unit as an inner side, a distance between opposing portions of the display unit is not less than a predetermined distance.

9 Claims, 7 Drawing Sheets

(51) Int. Cl.
  *H01L 51/52* (2006.01)
  *H01L 27/32* (2006.01)
  *H01L 51/00* (2006.01)

(56) References Cited

U.S. PATENT DOCUMENTS

| | | |
|---|---|---|
| 2014/0192530 A1 | 7/2014 | Liu |
| 2015/0277506 A1* | 10/2015 | Cheah .................. G06F 1/1615 361/679.27 |
| 2015/0325804 A1 | 11/2015 | Lindblad |
| 2015/0378391 A1 | 12/2015 | Huitema et al. |
| 2016/0037625 A1 | 2/2016 | Huitema et al. |
| 2016/0109078 A1* | 4/2016 | Liu .................. G02F 1/133603 362/97.1 |
| 2016/0118616 A1 | 4/2016 | Hiroki et al. |
| 2017/0061836 A1* | 3/2017 | Kim ...................... G06F 1/1652 |
| 2017/0094775 A1* | 3/2017 | Fan ...................... G06F 1/1652 |
| 2017/0208157 A1* | 7/2017 | Kim ...................... G06F 1/1652 |
| 2017/0235341 A1* | 8/2017 | Huitema ................ G04G 17/08 361/679.03 |
| 2017/0269720 A1* | 9/2017 | Mao ...................... G06F 3/041 |
| 2018/0020556 A1* | 1/2018 | Seo ...................... G06F 1/1641 |
| 2018/0046214 A1* | 2/2018 | Inagaki .................. G06F 1/163 |
| 2018/0150107 A1* | 5/2018 | Lee ...................... G06F 1/1681 |
| 2018/0279489 A1 | 9/2018 | Ochi et al. |
| 2018/0314299 A1* | 11/2018 | Xia ...................... G06F 1/1641 |

FOREIGN PATENT DOCUMENTS

| | | |
|---|---|---|
| JP | 2015-509217 A | 3/2015 |
| JP | 2015-228022 A | 12/2015 |
| JP | 2016-085972 A | 5/2016 |
| JP | 2017-504069 A | 2/2017 |
| WO | 2017/051788 A1 | 3/2017 |

\* cited by examiner

DISPLAY DEVICE

TECHNICAL FIELD

The disclosure relates to a display device, and particularly, to a flexible display device.

BACKGROUND ART

In a case where a display unit included in a display device is, for example, a flexible display unit constituted by EL elements, the display device may also be desired to be flexible.

CITATION LIST

Patent Literature

PTL 1: JP 2014-519626 A (published on Aug. 14, 2015)
PTL 2: JP 2015-228022 A (published on Dec. 17, 2015)

SUMMARY

Technical Problem

An object of the disclosure is to provide a display device that can be bent easily without producing particular defects such as providing a defect in a display unit, and that can particularly easily maintain a bent state.

Solution to Problem

A display device according to an aspect of the disclosure is a display device including a display unit and a housing. The housing includes a plurality of support parts and a bending part. At least two of the plurality of support parts are coupled via the bending part. The display unit is fixed to the plurality of support parts. The bending part is at least capable of bending with the display unit as an inner side. In a case where the bending part is bent with the display unit as an inner side, a distance between opposing portions of the display unit is not less than a predetermined distance.

Advantageous Effects of Disclosure

According to an aspect of the disclosure, the display device can be easily bent, and the bent state can be easily maintained.

BRIEF DESCRIPTION OF DRAWINGS

FIG. 1A illustrates a state in which the display device is flat, FIG. 1B illustrates a state in which the display device is bent, and FIG. 1C illustrates a state in which a portion of a bending part is viewed in a plan view.

FIG. 4A illustrates a state in which the display device is inner bending, and FIG. 4B illustrates a state in which the display device is outer bending.

FIG. 6A illustrates a state in which the second rotating block is bent, FIG. 6B illustrates the second rotating block extracted, and FIG. 6C illustrates a partial cross section of a coupling portion for a pair of the first rotating block and the second rotating block.

FIG. 7A illustrates a cross section of a bending part viewed in an oblique direction, FIG. 7B illustrates a cross section of the bending part in an unbent state, FIG. 7C illustrates a cross section of the bending part in a bent state, and FIG. 7D illustrates a cross section of a coupling portion according to another configuration.

EMBODIMENT

Figure 1A:
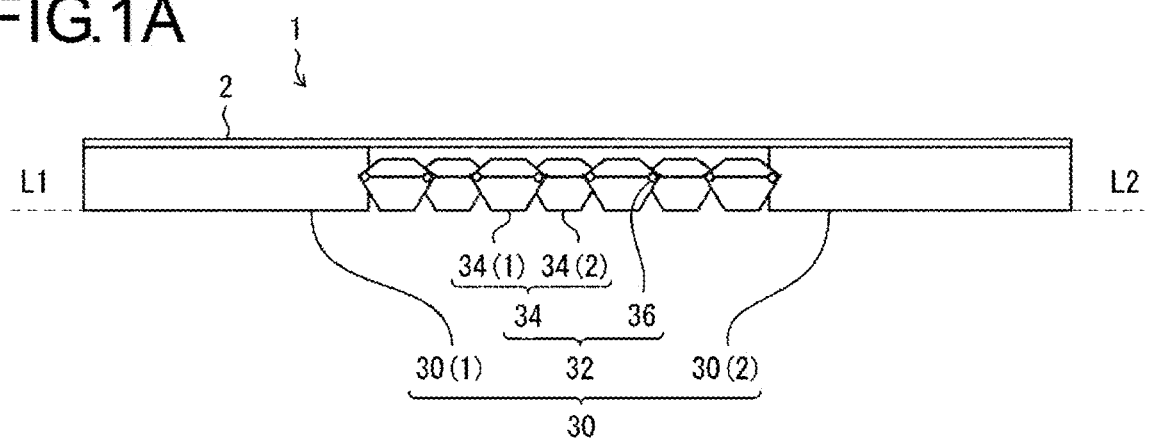
FIGS. 1A to 1C are diagrams illustrating an overview of a display device.
Figure 1B:
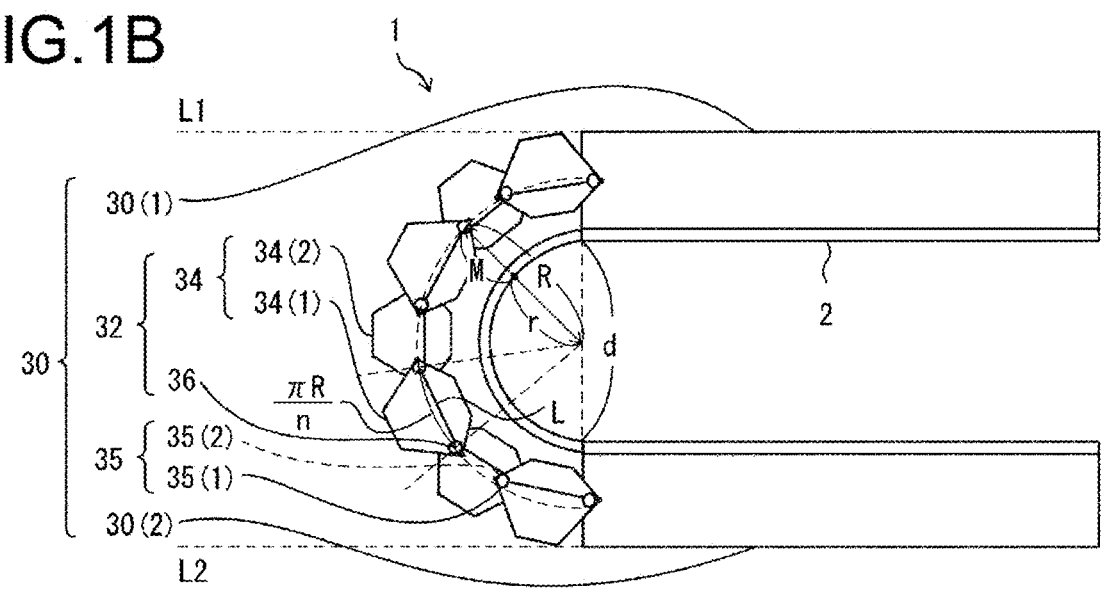

FIGS. 1A and 1B are diagrams illustrating an overview of a display device 1 according to the present embodiment. FIG. 1A illustrates a state in which the display device 1 is flat, and FIG. 1B illustrates a state in which the display device 1 is bent.

As illustrated in FIG. 1A, the display device 1 according to the present embodiment includes a display unit 2 and a housing 30. The housing 30 includes two support parts (first support part 30(1) and second support part 30(2)) and a bending part. Specifically, the first support part 30(1) is provided on one end of the bending part 32, and the second support part 30(2) is provided on the other end of the bending part 32, the support parts sandwiching the bending part 32. The bending part 32 is formed in a chain shape with a plurality of rotating blocks 34 and coupling pins 36 for coupling the rotating blocks. Furthermore, the rotating blocks 34 include first rotating blocks 34(1) and second rotating blocks 34(2) having different shapes. Note that the first rotating blocks 34(1) and the second rotating blocks 34(2) may have the same shape.

Figure 1C:
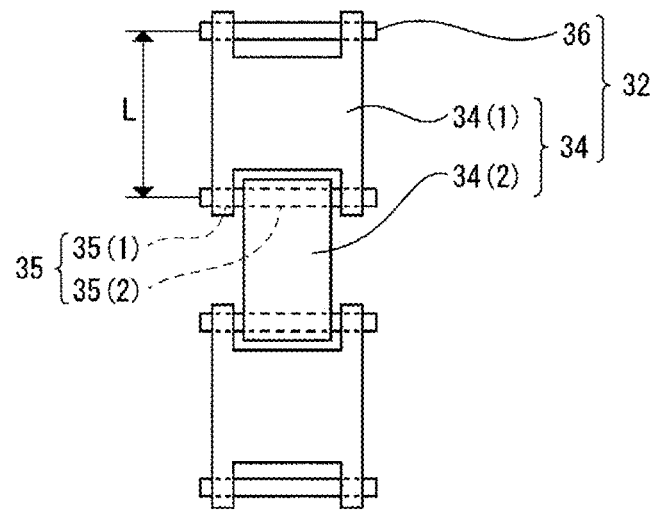

The bending part 32 will be described with reference to FIG. 1C. FIG. 1C is a plan view of a portion of the bending part 32. In FIG. 1C, three rotating blocks 34 (two first rotating blocks 34(1) and one second rotating block 34(2)) of the plurality of rotating blocks 34 that constitute the bending part 32 are illustrated.

As illustrated in FIG. 1C, each rotating block 34 is coupled by a coupling pin 36 inserted into a coupling hole 35.

Specifically, the coupling hole 35 for inserting the coupling pin 36 is provided in the rotating block 34. A first coupling hole 35(1) is provided in each first rotating block 34(1), and a second coupling hole 35(2) is provided in each second rotating block 34(2).

The coupling pin 36 is inserted into the first coupling hole 35(1) and the second coupling hole 35(2). Sharing the coupling pin 36 by the first rotating block 34(1) and the second rotating block 34(2) achieves coupling between the first rotating block 34(1) and the second rotating block 34(2).

Here, making either one or both of the first rotating block 34(1) or the second rotating block 34(2) capable of rotating about the coupling pin 36 allows the bending part 32 to bend.

According to the configuration above, the display device 1 according to the present embodiment can be in a flat plate state (open) as illustrated in FIG. 1A and be in a bent state, that is, a closed state (closed, inner bending) 180°, as illustrated in FIG. 1B.

Display Unit

First, the display unit 2 will be described.

Figure 2:
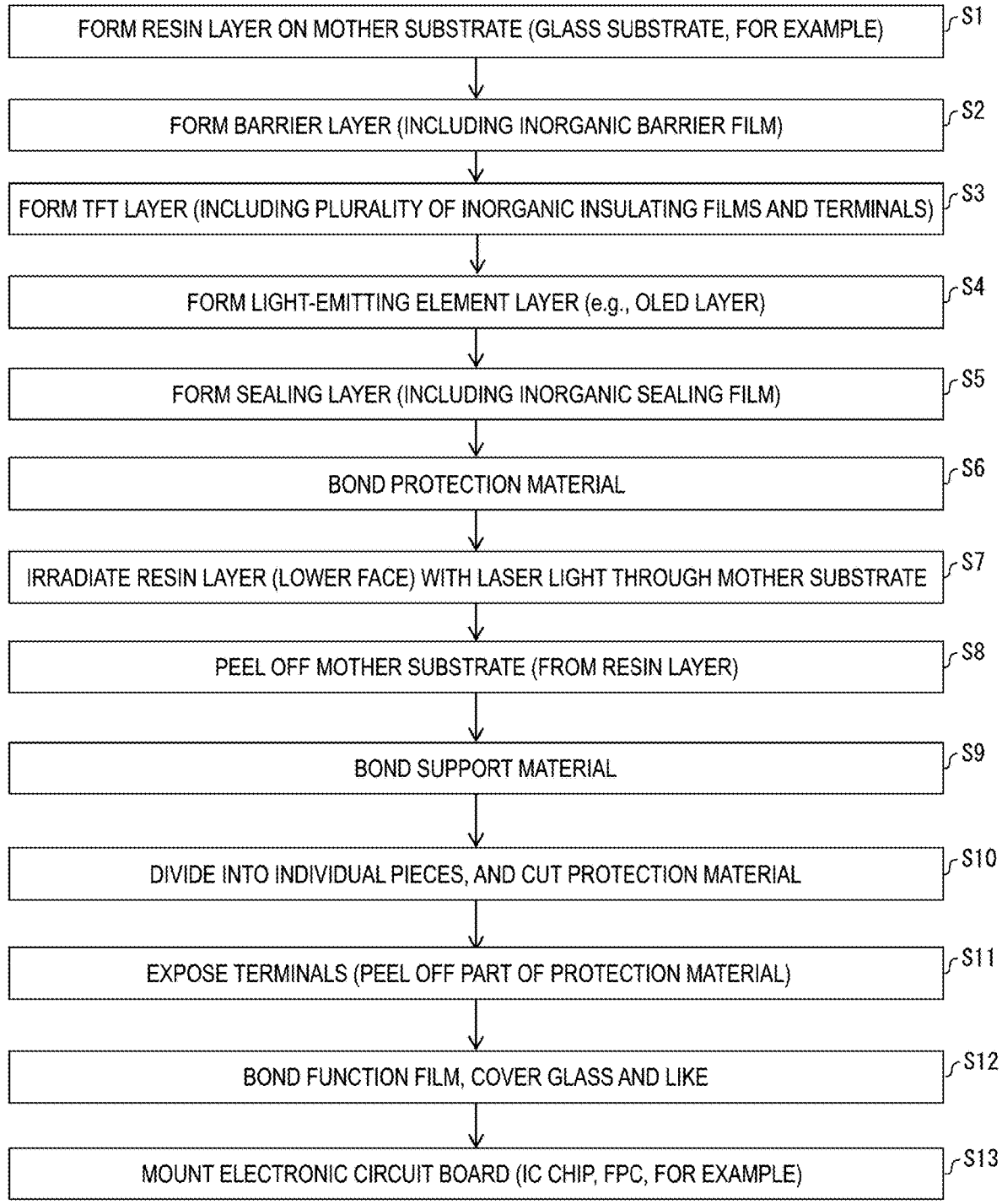
FIG. 2 is a flowchart illustrating an example of a manufacturing method for an EL display unit.
Figure 3A:
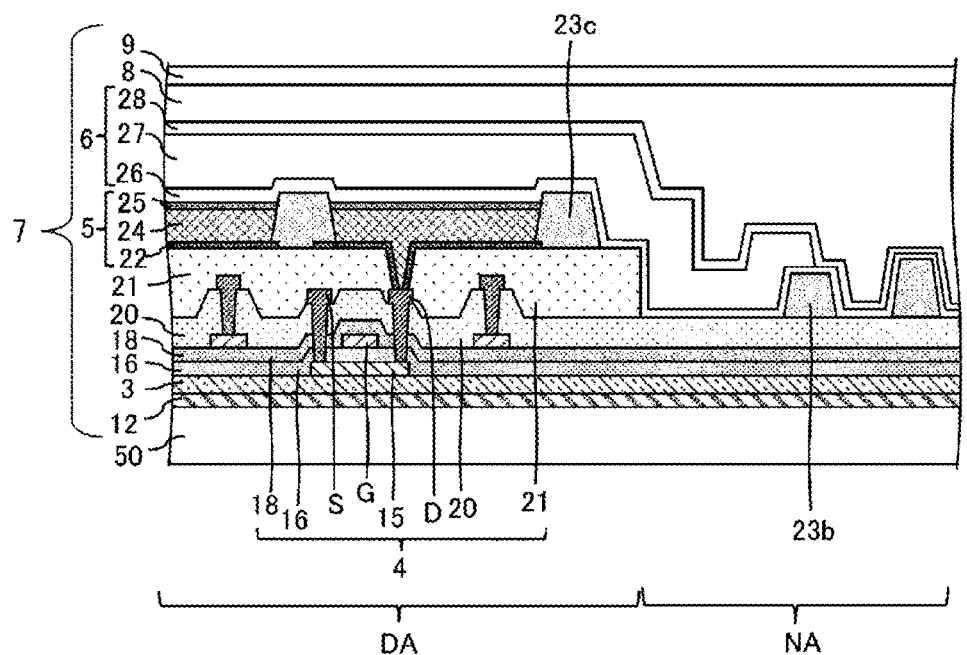
FIG. 3A is a cross-sectional view illustrating an example of a configuration of an EL display unit according to the present embodiment that is under formation.
Figure 3B:
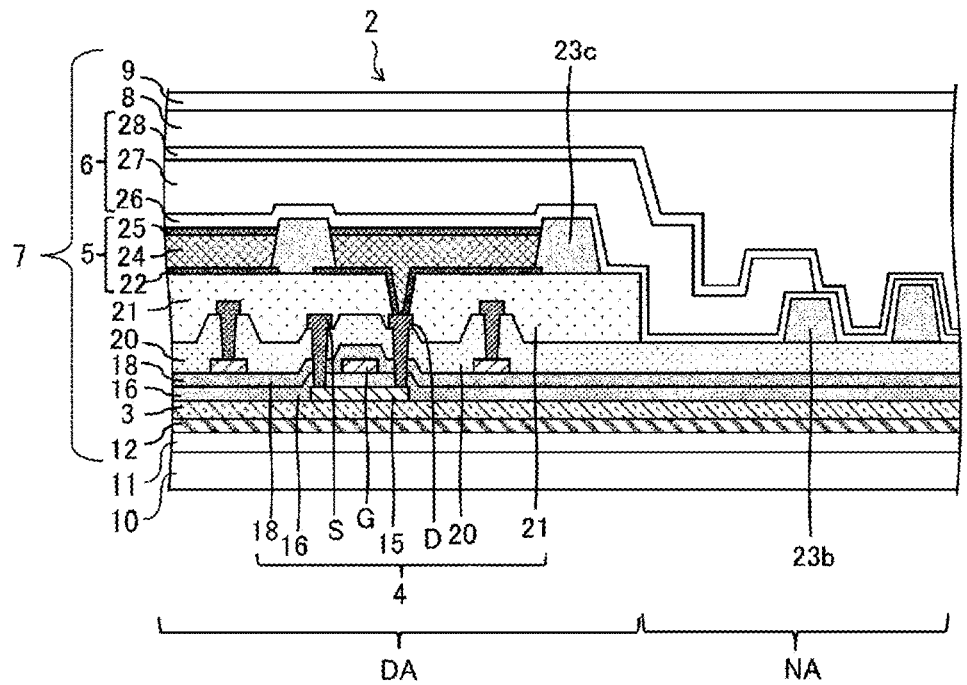
FIG. 3B is a cross-sectional view illustrating an example of a configuration of the EL display unit according to the present embodiment.

FIG. 2 is a flowchart illustrating an example of a manufacturing method of an EL display unit 2 as an example of the flexible display unit 2. FIG. 3A is a cross-sectional view illustrating a configuration example of the EL display unit 2 according to the present embodiment that is under formation. FIG. 3B is a cross-sectional view illustrating an example of a configuration of the EL display unit 2 according to the present embodiment.

In a case where a flexible EL display unit is manufactured, as illustrated in FIG. 2 and FIG. 3, substantially, the following Steps S1 to S13 will be performed.

Step S1: A resin layer 12 is formed on a transparent mother substrate 50 such as a glass substrate.

Step S2: An inorganic barrier film 3 is formed.

Step S3: A TFT layer 4 including a plurality of inorganic insulating films 16, 18, and 20 and a flattering film 21 is formed.

Step S4: A light-emitting element layer 5 such as an OLED element layer is formed.

Step S5: A sealing layer 6 including inorganic sealing films 26 and 28 and an organic sealing film 27 is formed.

Step S6: A protection material 9 such as a PET film is bonded on the sealing layer 6 via an adhesive layer 8.

Step S7: The resin layer 12 is irradiated with laser light. Herein, the resin layer 12 absorbs the laser light with which the resin layer 12 is irradiated, and thus the lower face of the resin layer 12 which is an interface with the mother substrate 50 changes quality due to ablation. This forms a peeling layer, which reduces bonding force between the resin layer 12 and the mother substrate 50.

Step S8: The mother substrate 50 is peeled from the resin layer 12. This causes the layered body 7 to be peeled from the mother substrate 50. Herein, the layered body 7 indicates the entire multilayer body formed on the mother substrate 50, and, in the example illustrated in FIG. 3A, indicates layers from the resin layer 12 formed on the mother substrate 50 to the protection material 9 which is the uppermost layer.

Step S9: A support material 10 such as a PET film is bonded to the lower face of the resin layer 12 via an adhesive layer 11.

Step S10: The mother substrate 50 is separated, and the protection material 9 is cut to cut out a plurality of EL display units.

Step S11: The protection material 9 on a terminal portion of the TFT layer 4 is peeled off to expose a terminal.

Step S12: A function film 39 is bonded.

Step S13: An electronic circuit board is mounted on the terminal portion using an ACF or the like.

With the above steps, the EL display unit 2 as one example of the flexible display is formed. Note that a manufacturing system executes all the steps described above.

Note that in FIGS. 3A and 3B, 4 denotes a TFT layer, 15 denotes a semiconductor film, 16 denotes a gate insulating film, 22 denotes an anode electrode, 23b denotes a bank, 23c denotes a partition, 24 denotes an EL layer, 25 denotes a cathode electrode, 26 denotes a first inorganic sealing film, 27 denotes an organic sealing film, 28 denotes a second inorganic sealing film, G denotes a gate electrode, S denotes a source electrode, D denotes a drain electrode, DA denotes an active area, and NA denotes a non-active area.

The active area DA corresponds to an area where the light-emitting element layer 5 is formed (an area where the semiconductor film 15, the gate electrode G, the source electrode S, and the drain electrode D are formed) and can be represented as a display area. In contrast, the non-active area NA is an area except for the active area DA and is an area where terminals used for connection with the electronic circuit board and the like are formed.

Housing

Next, the housing 30 will be described.

The housing 30 includes two support parts (first support part 30(1) and second support part 30(2)) and a bending part 32. The first support part 30(1) and the second support part 30(2) have a flat plate shape and are formed by resin, metal, or the like. The first support part 30(1) and the second support part 30(2) are respectively connected to the both end portions of the bending part 32 having a chain shape. The total length of the first support part 30(1), the bending part 32, and the second support part 30(2) is substantially the same as the length of the display unit 2 in the corresponding direction.

The display unit 2 is fixed to the surface of the first support part 30(1) and the second support part 30(2) facing in the same direction in the flat plate state illustrated in FIG. 1A. As a result, the display unit 2 and the housing 30 are integrated, and the display device 1 is configured.

Note that the number of support parts provided on the housing 30 is not limited to two, and may be any number of two or more depending on the size and application of the display unit 2. As described above, the support parts are coupled via a bending part 32. Therefore, the number of bending parts 32 also increases or decreases depending on the number of support parts.

Overview of Bending Part

Next, the bending part 32 will be described.

Figure 4A:
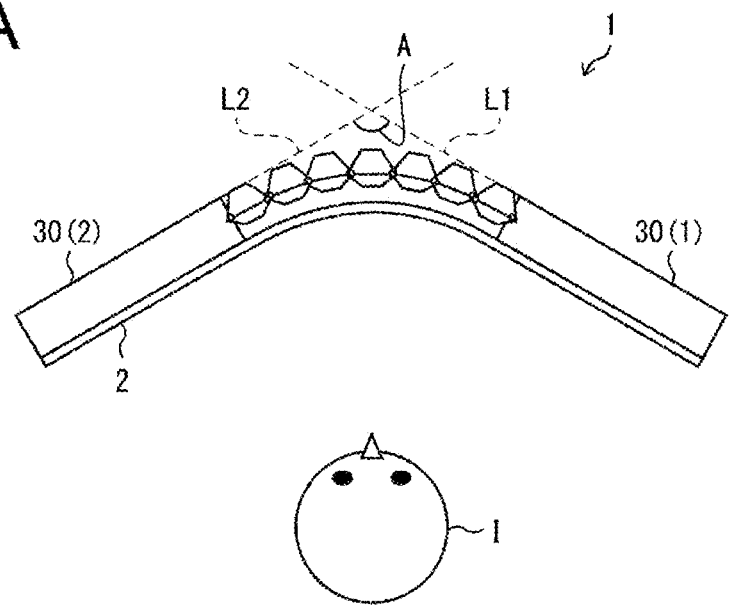
FIGS. 4A and 4B are diagrams illustrating an overview of the display device.
Figure 4B:
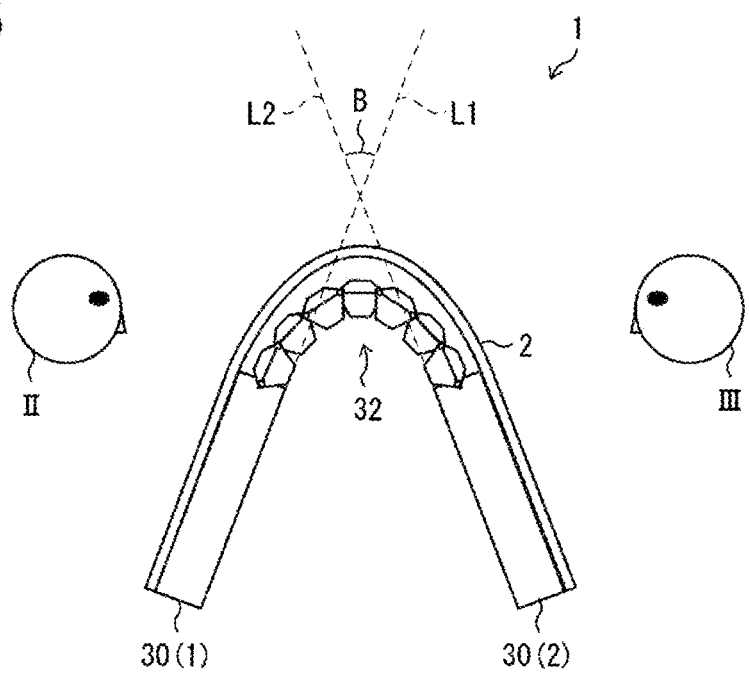

As described above, the bending part 32 is formed in a chain shape by the plurality of rotating blocks 34 being coupled via the coupling pins 36. As such, the bending part 32 can bend at any angle. In addition to FIGS. 1A and 1B, details of the embodiment will be described below with reference to FIGS. 4A and 4B. FIG. 4A illustrates a state in which the display device 1 is inner bending, and FIG. 4B illustrates a state in which the display device 1 is outer bending. Here, "inner bending" means that the display device 1 is bent so that the display unit 2 is inside the housing 30, and, in contrast, "outer bending" means that the display device 1 is bent so that the display unit 2 is outside of the housing 30.

Surround

In the display device 1 according to the present embodiment, a bent state as illustrated in FIG. 4A can be created in addition to the closed bent state illustrated in FIG. 1B. The bent state illustrated in FIG. 4A is a state in which the display device 1 is bent such that the EL display unit 2 is inside. Specifically, the state is a state in which the display device 1 is bent such that an angle A at which a dotted line L1, which is an extended line of the first support part 30(1), and a dotted line L2, which is an extended line of the second support part 30(2), intersect is 120°, for example. That is, the state is a bent state (surround) between a flat plate state (open) in which the dotted line L1 and the dotted line L2 illustrated in FIG. 1A are aligned on a straight line, and the bent state (closed) in which the dotted line L1 and the dotted line L2 illustrated in FIG. 1B are in parallel.

In this bent state, the bent EL display unit 2 surrounds the user I. Thus, the user I can obtain a feeling of surround system, a sense of reality, or the like from the video or the like displayed in the EL display unit 2.

Facing

Another bent state is the bent state illustrated in FIG. 4B. This bent state is a bent state (facing) in which the display device 1 is bent so that the EL display unit 2 is outside. Specifically, the display device 1 is in a bent state with the EL display unit 2 being outside so that an angle B at which the dotted line L1, which is the extended line of the first support part 30(1), and the dotted line L2, which is the extended line of the second support part 30(2), intersect is, for example, 30°.

In this bent state, a plurality of users, for example, a user II and a user III, can view the EL display unit 2 from positions facing each other. For this reason, the display device 1 can be suitably used in applications in which a video or the like displayed on the EL display unit 2, for example, a multi-player game, is viewed by a plurality of users from different angles.

As described above, the display device 1 according to the present embodiment is capable of bending the display device 1 to any angle. Any of the inner bending and the outer bending are possible for the direction of bending. In addition, each bent state can be maintained.

An example of a specific configuration of the bending part and the like will be described below.

Operating Range

First, the operating range will be described.

Figure 5:
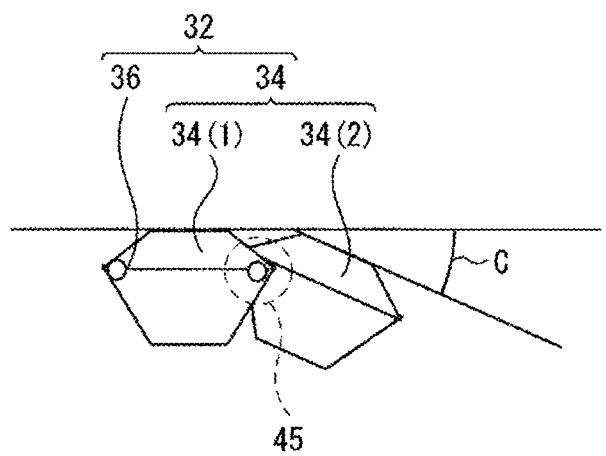
FIG. 5 is a diagram in which one set of a first rotating block, a second rotating block, and a pin is extracted.

An operating region means a possible range of a bending angle (angle C in FIG. 5) taken by a pair of first rotating block 34(1) and second rotating block 34(2) adjacent to each other. FIG. 5 is a diagram illustrating a set of the first rotating block 34(1), the second rotating block 34(2), and the coupling pin 36 provided in the bending part 32. The dotted circle in FIG. 5 illustrates a coupling portion 45 for the first rotating block 34(1) and the second rotating block 34(2).

As illustrated by angle C in FIG. 5, defining an operating region between a pair of first rotating block 34(1) and second rotating block 34(2) adjacent to each other can prevent the display device 1 from bending too far. Specifically, defining the operating region can control the bend radius and the distance between portions of the display unit, for example, in a state in which the display device 1 illustrated in FIG. 1B is closed. Here, the bend radius is a length indicated by r in FIG. 1B, and refers to a radius in a form of the bending part 32 in a state in which the display device 1 is closed. The distance between portions of the display unit is a length indicated by d in FIG. 1B, and refers to a distance between opposing portions of the EL display unit 2 in a state in which the display device 1 is closed.

Distance Between Portions of Display Unit

The distance d between portions of the display unit will be described with reference to FIG. 1B.

In the display device 1 in the bent state illustrated in FIG. 1B, d represents a distance between the opposing portions of the display unit 2 as described above, R represents a radius of the bending part 32, r represents a radius of the display unit 2, n represents the number of rotating blocks 34 provided between two support parts (first support part 30(1) and second support part 30(2)), L represents a distance between two coupling holes provided in one rotating block 34, La represents the average of L in n, and M represents a distance between the display unit 2 and the coupling hole 35. Note that the radius R of the bending part refers to the radius of an arc drawn by connecting the coupling holes 35.

Here, as illustrated in FIG. 1B, r=R−M
also, approximately La=πR/n,
thus, approximately r=nLa/π−M.

Thus, the distance d between portions of the display unit is approximately d=2 (nLa/π−M).

In a case where r is too small (for example, a limit bend radius of a folding type mobile terminal (a predetermined value for radius) is exceeded), failure such as breakage of the EL display unit 2 and disconnection of wiring lines in the EL display unit 2 is likely to occur.

In a case where d is too small (a limit distance (a predetermined distance)), failure may occur such as opposing portions of the EL display unit 2 coming into contact, causing scratching in the EL display unit 2.

Therefore, optimally configuring (predetermined angle) the operating region in accordance with the number of rotating blocks 34 provided on the bending part 32, the size thereof, and the like can achieve preferable r and d. Examples of the operating region include 30°.

From the perspective of suppressing breakage of the EL display unit 2 and contact of opposing portions of the EL display unit 2, the bending angle c is preferably 45° or less, and from the perspective of achieving a design in which the bending part forms a smooth curve, the bending angle c is more preferably 10° or less. By making the bend angle c a lower angle, bending points are increased and a smoother bending part can be realized.

Note that the distance L between the coupling holes in the plurality of rotating blocks 34 provided between the support parts (the first support part 30(1) and the second support part 30(2)) is not particularly limited, but preferably has one type or two types. This is because it is easy to achieve a uniform bent state.

The operating region is not only an operating region in the outer bending illustrated in FIG. 5, but an operating region in the inner bending can also be configured appropriately. For example, in a case where the operating region in the inner bending is assumed as a positive (+) side, the operating region in the outer bending is negative (−), and the operating region may be configured to be not less than −α° and not greater than +β°.

As described above, the display device 1 according to the present embodiment, in normal use, can be in a flat plate state with a bending angle of 0° (open, FIG. 1A), and when not used, can be in a bent state (closed, FIG. 1B) with a bending angle of 180°. Thus, in normal use, the display unit 2 is used as a single surface and can display on a wide screen, whereas when not used, the EL display unit 2 can be protected and the display device 1 can be held up in a compact manner. In addition, the display device 1 may also be used in a bent state (surround, FIG. 4A) between the open flat plate state and the closed bent state such that the screen surrounds the user.

The display device 1 according to the present embodiment allows the outer bending in addition to the inner bending described above, so that it is also possible to achieve a bent state (facing, FIG. 4B) in which the display unit 2 can be viewed while two users are facing each other.

In addition, in the display device 1 according to the present embodiment, the operating range is configured, and thus, for example, it is possible to prevent the display device 1 from bending too far in a closed or facing bent state. For example, it is possible to prevent the display unit 2 from becoming like seaming and prevent the display unit 2 from being applied with excessive pressure. This allows the display device 1 to open and close from 0° to 180° without r exceeding the limit bend radius.

An example of a configuration of the display device 1 according to the present embodiment will be described in further detail below.

Configuration for Operating Region

Various configurations are conceivable for the provision of the operating region. For example, a configuration can be exemplified in which, in FIG. 5, in a case where the bending angle C between the first rotating block 34(1) and the second rotating block 34(2) adjacent to each other is an allowable maximum value (the bending angle corresponding to the maximum value of the operating region), the first rotating block 34(1) and the second rotating block 34(2) come into contact and do not bend further.

Configuration for Maintaining

Next, a mechanism for maintaining the bent state of the bending part 32 will be described.

Preferably, the bending part 32 can be in any bent state within the range of the operating region and the state can be maintained.

Various configurations are conceivable in which the bent state is maintained. For example, a configuration is conceivable in which the frictional resistance is increased at the point where the first rotating block 34(1) and second rotating block 34(2) adjacent to each other rotate. According to this configuration, in addition to being able to easily make the bending part 32 into any bent state, the bent state thereof can be maintained.

Other configurations include, for example, a configuration in which the first rotating block 34(1) and the second rotating block 34(2) adjacent to each other are coupled with a pin different from the coupling pin 36. Pin holes are arranged so as to be able to lock the first rotating block 34(1) and the second rotating block 34(2) only within the range of the operating region. In other words, coupling with a pin is not allowed in a position where the bending angle is outside the operating region. At this time, by providing a plurality of pin holes within the range of the operating region, the bending part 32 can be in various bent states and the bent state thereof can be maintained. A configuration example of the bending part 32 using a pin and a hole will be described below.

Specific Example

Figure 6A:
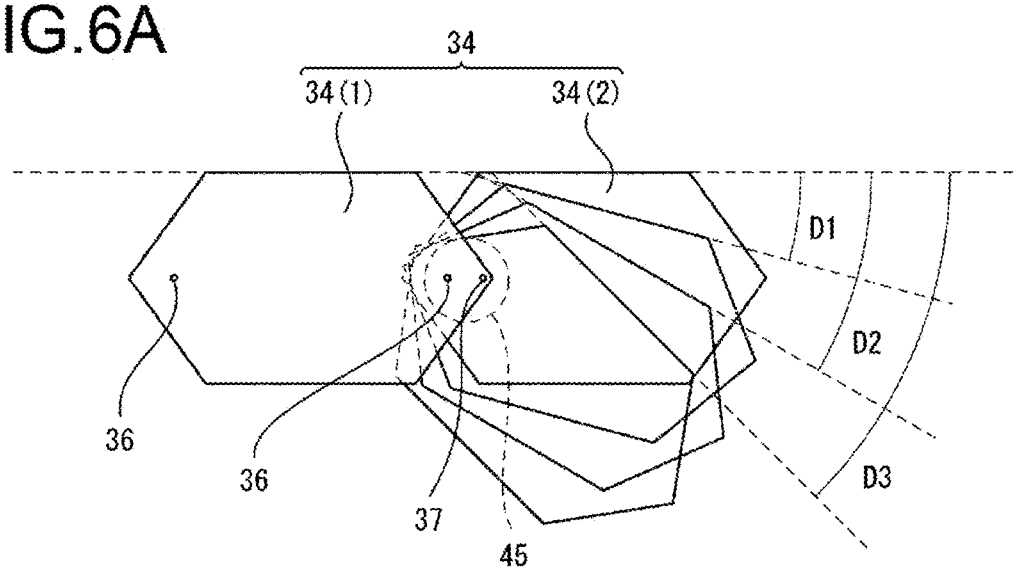
FIGS. 6A to 6C are diagrams illustrating rotating blocks.
Figure 6B:
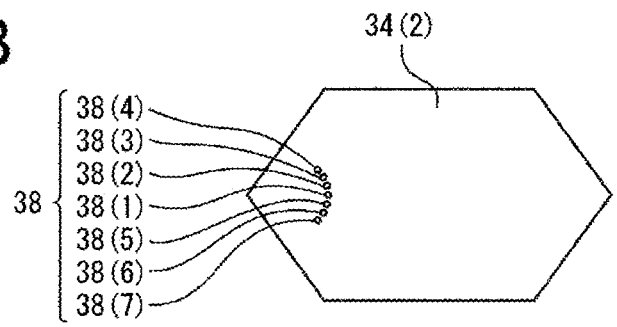
Figure 6C:
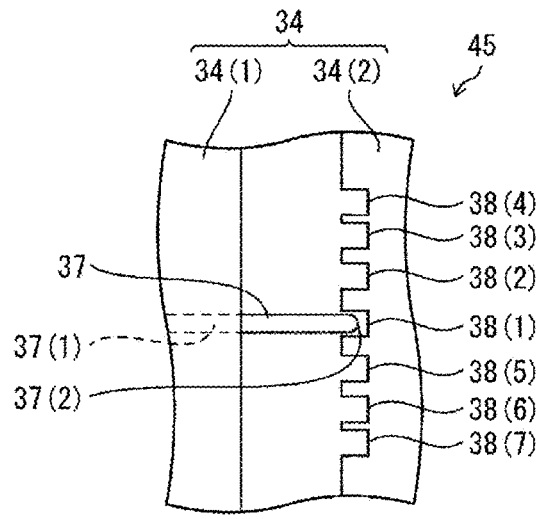

FIGS. 6A to 6C are diagrams illustrating a configuration of the bending part using a pin and holes. FIG. 6A illustrates a state in which the second rotating block 34(2) is bent, FIG. 6B illustrates the second rotating block 34(2) extracted, and FIG. 6C is a diagram illustrating a partial cross section of the coupling portion 45 of a pair of the first rotating block 34(1) and the second rotating block 34(2) as viewed from the coupling direction (extension direction of the chain) of the bending part. The configuration illustrated in FIGS. 6A to 6C is an example of a configuration in which a pin and holes are used to define an operating region and maintain a bent state.

As illustrated in FIG. 6A, the first rotating block 34(1) is provided with a rotation control pin 37 for controlling the bent state of the rotating blocks 34 in addition to the coupling pin 36 that couples the first rotating block 34(1) and the second rotating block 34(2).

On the other hand, as illustrated in FIG. 6B, the second rotating block 34(2) is provided with a plurality of rotation control hole 38(1) to rotation control hole 38(7) into which the tip of the rotation control pin 37 can fit. In this configuration example, the rotation control pin 37 fits into a rotation control hole 38, thereby maintaining the bent state.

More specifically, the present configuration may maintain its state in six bent states, in addition to the unbent state.

Outer Bending

First, outer bending will be described.

The three types of bent states with bending angles D1, D2, and D3, illustrated in FIG. 6A, are bent states corresponding to the outer bending.

In the unbent state, the rotation control pin 37 fits in the rotation control hole 38(1). With the rotating block 34 being bent and the bending angle being D1, the rotation control pin 37 fits in the rotation control hole 38(2). This bent state is maintained because the bending angle is fixed by the rotation control pin 37 fitting in the rotation control hole 38(2). As bending advances further, at the bending angle D2, the rotation control pin 37 fits into the rotation control hole 38(3) and, similarly, at the bending angle D3, the rotation control pin 37 fits in the rotation control hole 38(4). In this way, each bent state is maintained.

Inner Bending

Bending the rotating blocks 34 to the opposite side of the outer bending achieves the inner bending in the same manner as the outer bending. Here, the opposite side refers to bending in the positive direction, in a case where the unbent state is in the bending angle of 0° and the bending angles (D1 to D3) illustrated in FIG. 6A are negative directions (see FIG. 6C).

Specifically, fitting the rotation control pin 37 into the rotation control hole 38(5) achieves a bent state of the inner bending, and as the rotation control hole that fits into the rotation control pin 37 is advanced to the rotation control hole 38(6) to the rotation control hole 38(7), bending of the inner bending proceeds. Furthermore, in the same manner as the outer bending, fitting the rotation control pin 37 to one of the rotation control holes 38 allows each bent state to be maintained.

Coupling Portion

The coupling portion 45 of the first rotating block 34(1) and the second rotating block 34(2) will be described in further detail with reference to FIG. 6C. As illustrated in FIG. 6C, the first rotating block 34(1) and the second rotating block 34(2) are coupled via a pin (not illustrated), and the rotation control pin 37 different from the coupling pin 36 is provided on the first rotating block 34(1). The rotation control pin 37 is formed so that a tip portion 37(2) fits into any of the rotation control holes 38 provided in the second rotating block 34(2). A case where the rotation control pin 37 fits in the rotation control hole 38(1) corresponds to a state in which the rotating block 34 is not bent. Then, as the hole in which the rotation control pin 37 fits is advanced to the rotation control hole 38(2), the rotation control hole 38(3), and the rotation control hole 38(4), the bending angle increases to D1, D2, and D3, respectively (outer bending). On the other hand, as the hole in which the rotation control pin 37 fits is advanced to the rotation control hole 38(5), the rotation control hole 38(6), and the rotation control hole 38(7), the bending angle increases in the inner bending direction.

Structure of Rotation Control Pin

The rotation control pin 37 includes a spring (not illustrated), and in a case where a rear portion 37(1) of the rotation control pin 37 is pushed, the tip portion 37(2) of the rotation control pin 37 moves in a direction that removes from the rotation control hole 38. Thus, for releasing the keep of the bent state, the rotation control pin 37 is pushed and the tip portion 37(2) of the rotation control pin 37 is removed from the rotation control hole 38. The rotating blocks 34 are then bent until the tip portion 37(2) of the rotation control pin 37 reaches the position of another desired rotation control hole 38 while the rotation control pin 37 remains pressed. In a case where the tip portion 37(2)

of the rotation control pin 37 is positioned in the other desired rotation control hole 38, pressing of the rotation control pin 37 is stopped (the rotation control pin 37 is released), and thus the tip portion 37(2) of the rotation control pin 37 fits into the desired rotation control hole 38, thereby maintaining the bent state.

Note that the position, number, spacing, and the like of the holes are not particularly limited. For example, holes may be provided to bend in stages (e.g. per 10° increments) between the open bending angle of 0° to the close bending angle of 180° or −180°.

The configuration for controlling the rotation is not limited to the configuration described above using a pin and holes, and various configurations are conceivable.

In each of the drawings used for the description, the first rotating block 34(1) and the second rotating block 34(2) have a hexagonal shape. However, the shape of the first rotating block 34(1) and the second rotating block 34(2) is not limited to a polygon such as a hexagon, and may be, for example, a round shape. Even in a polygon, a regular polygon or an asymmetric polygon can be used.

The configuration of the bending part 32 is not limited to a configuration in which rotating blocks including two rotation coupling mechanisms (pins 37) are coupled in a chained manner, and various configurations are conceivable.

Other Configuration Example

Figure 7A:
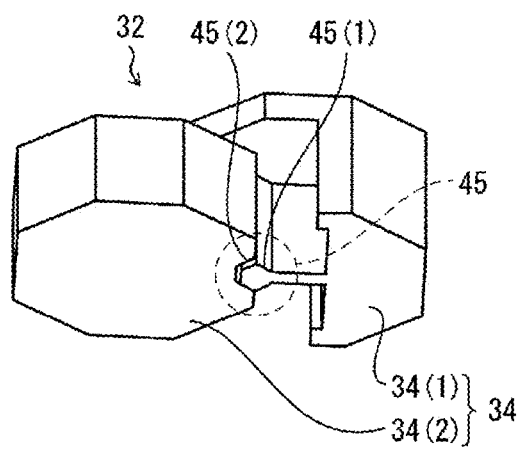
FIGS. 7A to 7D are diagrams in which a pair of a first rotating block and a second rotating block according to another configuration is extracted.
Figure 7B:
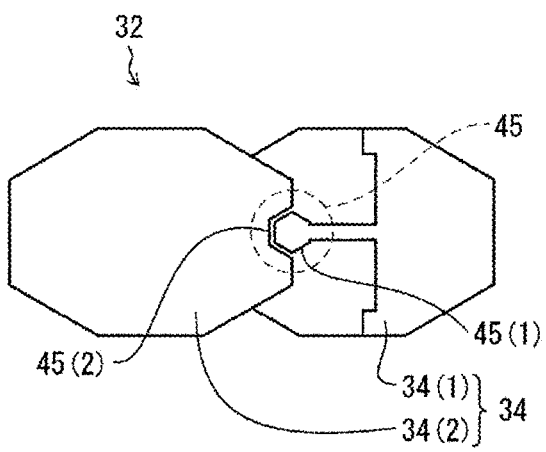
Figure 7C:
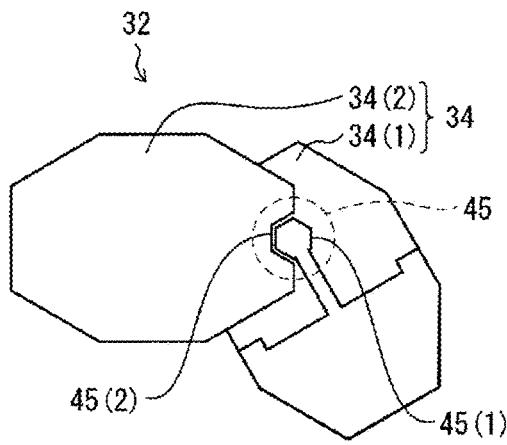
Figure 7D:
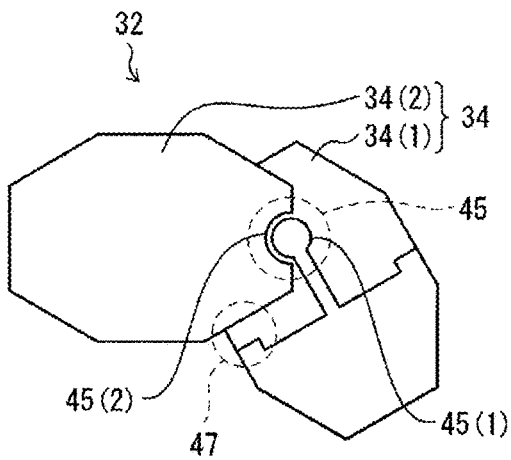

Other configurations of the bending part 32 will be described with reference to FIGS. 7A to 7D. FIGS. 7A to 7D are diagrams in which a pair of the first rotating block 34(1) and the second rotating block 34(2) according to another configuration is extracted. FIG. 7A illustrates a cross section of the bending part 32 viewed from an oblique direction, FIG. 7B illustrates a cross section of the bending part 32 in an unbent state, FIG. 7C illustrates a cross section of the bending part 32 in a bent state, and FIG. 7D illustrates a cross section of the coupling portion 45 according to another configuration. Note that FIG. 7A illustrates the rotating block 34 with a portion thereof cut off so that the internal structure of the rotating block 34 is seen.

The first rotating block 34(1) and the second rotating block 34(2) illustrated in FIG. 7A differ in the outer shape and the configuration of the coupling portion 45 from the first rotating block 34(1) and the second rotating block 34(2) illustrated in FIG. 5 above.

The outer shape illustrated in FIG. 5 is a hexagon, while the outer shape illustrated in FIGS. 7A to 7D is an octagonal shape. In terms of the coupling portion 45, FIG. 5 illustrates a configuration including the coupling pin 36, while FIGS. 7A to 7D illustrate a hinge structure based on a polygonal shape. Hereinafter, the coupling portion 45 will be described.

In the coupling portion 45 of the first rotating block 34(1) and the second rotating block 34(2) illustrated in FIGS. 7A to 7D, a protruding portion provided in the first rotating block 34(1) and a recessed portion provided in the second rotating block 34(2) are fitted each other.

Specifically, a first rotating block coupling protruding portion 45(1) is provided in the first rotating block 34(1) and a second rotating block coupling recessed portion 45(2) is provided in the second rotating block 34(2) at the position corresponding to the coupling portion 45. In the configuration example illustrated in FIG. 7A, the first rotating block coupling protruding portion 45(1) has a hexagonal shape at the tip thereof, while the second rotating block coupling recessed portion 45(2) has a shape in which half of a hexagonal shape is cut out. As described above, the first rotating block coupling protruding portion 45(1) and the second rotating block coupling recessed portion 45(2) have a shape based on a polygonal shape, in other words, a shape in which each of the protruding shape and the recessed shape corresponds to a portion of a polygonal shape having the same number of corners.

The sizes of the hexagonal shapes correspond to each other. Specifically, the hexagonal shape of the second rotating block coupling recessed portion 45(2) has a shape that is slightly larger than the hexagonal shape of the first rotating block coupling protruding portion 45(1). As a result, the first rotating block coupling protruding portion 45(1) and the second rotating block coupling recessed portion 45(2) are capable of being fitted and capable of rotating.

In a state that the bending part 32 is not bent, as illustrated in FIG. 7B, the first rotating block 34(1) and the second rotating block 34(2) are coupled so as to extend in a linear manner.

In a state that the bending part 32 is bent, as illustrated in FIG. 7C, the first rotating block 34(1) and the second rotating block 34(2) extend in a non-linear manner while the hexagonal shape of the first rotating block coupling protruding portion 45(1) and the hexagonal shape of the second rotating block coupling recessed portion 45(2) are fitted in the coupling portion 45.

In a case where the first rotating block 34(1) rotates about the coupling portion 45, the corresponding corner in the hexagonal shape shift in order in the first rotating block coupling protruding portion 45(1) and the second rotating block coupling recessed portion 45(2). As a result, the first rotating block coupling protruding portion 45(1) and the second rotating block coupling recessed portion 45(2) are capable of being bent while the hexagonal shapes remain fitting each other.

As described above, in the configuration example illustrated in FIG. 7C, since the first rotating block coupling protruding portion 45(1) and the second rotating block coupling recessed portion 45(2) are formed in a polygonal shape, the bent state can be changed stepwise rather than continuously. Therefore, by changing the shape and the number of corners of the polygonal shape, possible bent states can be predetermined. Thus, it is possible to configure to bend only at a desired angle.

Note that in the configuration example illustrated in FIG. 7C, the coupling portion 45 is configured based on a hexagonal shape. However, for example, by increasing the number of corners, it is possible to bend with more stages and more finely, or more smoothly.

Maintaining of Bent State

Next, the maintaining of the bent state will be described.

As the configuration example illustrated in FIG. 7A and the like, in a case where the coupling portion 45 is configured based on a polygonal shape, the bent state can be maintained by using the fitting in the coupling portion 45. In a case where the bent state is maintained by using the fitting, changing the tightness of the fitting (the size of the interval (gap) between the first rotating block coupling protruding portion 45(1) and the second rotating block coupling recessed portion 45(2)), the depth of the fitting (the degree of entry of the protruding shape (the first rotating block coupling protruding portion 45(1)) into the recessed shape (the second rotating block coupling recessed portion 45(2) in the coupling portion 45), and the like can change the force to maintain the bent state and the force required to change the bent state.

By maintaining the bent state by using the fitting in the coupling portion 45, it is possible to maintain the bent state without providing special auxiliary measures.

Note that in the configuration example illustrated in FIG. 7A or the like, the bent state can be maintained by using the rotation control pin 37 described with reference to FIG. 6A or the like.

Round Shape

The coupling portion 45 can also be configured based on a shape other than a polygonal shape. FIG. 7D illustrates an example in which the coupling portion 45 is configured based on a round shape. Specifically, in the example illustrated in FIG. 7D, the first rotating block coupling protruding portion 45(1) is configured in a round protruding shape, while the second rotating block coupling recessed portion 45(2) is configured in a corresponding round recessed shape.

Configuring the coupling portion 45 based on a round shape can change the bent state continuously. In terms of maintaining of the bent state, for example, the rotation control pin 37 described with reference to FIG. 6A or the like may be used to maintain.

Restriction of Bending

Next, the restriction of bending will be described with reference to FIG. 7D. The dotted circle 47 in FIG. 7D illustrates a bending regulating portion 47.

As illustrated in FIG. 7D, in a case where the bending of the bending part 32 increases, the first rotating block 34(1) and the second rotating block 34(2) may come into contact with each other in the bending regulating portion 47.

Thus, defining the shape of the first rotating block 34(1) and the second rotating block 34(2) at the position corresponding to the bending regulating portion 47 can regulate the maximum angle of bending.

Specifically, a configuration is conceivable in which, for example, a protruding portion that comes into contact with the second rotating block 34(2) in a case of bending, at a position corresponding to the bending regulating portion 47 of the first rotating block 34(1). In this configuration, in a case where the height of the protruding portion is increased, the maximum angle of bending can be reduced, and conversely, in a case where the height of the protruding portion is lowered, the maximum angle of bending can be increased.

Flexible Display

The flexible display according to the present embodiment is not particularly limited as long as the display panel is flexible and provided with flexible light-emitting elements. The light-emitting element is a light-emitting element whose luminance and transmittance are controlled by an electric current, and examples of the electric current-controlled light-emitting element include an organic Electro Luminescence (EL) display including an Organic Light Emitting Diode (OLED), an EL display such as an inorganic EL display including an inorganic light-emitting diode, and a Quantum dot Light Emitting Diode (QLED) display including a QLED.

Supplement

A display device according to Aspect 1 of the disclosure is a display device including a display unit; and a housing, wherein the housing includes a plurality of support parts and a bending part, at least two of the plurality of support parts are coupled via the bending part, the display unit is fixed to the plurality of support parts, the bending part is at least capable of bending with the display unit as an inner side, and in a case where the display device is closed with the display unit as an inner side, a distance between opposing portions of the display unit is not less than a predetermined distance d.

In a display device according to Aspect 2, in the case where the display device is closed with the display unit as an inner side, a bend radius of the bending part is not less than a predetermined value.

In a display device according to Aspect 3, the bending part does not bend at a predetermined angle or more.

In a display device according to Aspect 4, a bent state of the bending part is maintained.

In a display device according to Aspect 5, the bending part is configured with a plurality of rotating blocks being coupled.

In a display device according to Aspect 6, a coupling hole used for coupling adjacent rotating blocks of the plurality of rotating blocks is provided in each of the plurality of rotating blocks, a coupling pin is inserted into the coupling hole, two of the adjacent rotating blocks share the coupling pin to couple the adjacent rotating blocks with each other, and at least one of the adjacent rotating blocks is capable of rotating about the coupling pin.

In a display device according to Aspect 7, two of the coupling holes are provided in each of the plurality of rotating blocks, and an inter-holes distance L between the two of the coupling holes in one of the plurality of rotating blocks is one type or two types in the plurality of rotating blocks constituting the bending part.

In a display device according to Aspect 8, in a case where a number of the plurality of rotating blocks provided between the two of the plurality of support parts is n, an average of the inter-holes distance L in n rotating blocks is La, and a distance between the display unit and the coupling hole is M, the distance d is $d = 2(nLa/\pi - M)$.

In a display device according to Aspect 9, one of the adjacent rotating blocks is provided with a rotation control pin, the other is provided with a plurality of rotation control holes, and a bent state of the bending part is selected and the bent state is maintained by the rotation control pin fitting into one of the plurality of rotation control holes.

In a display device according to Aspect 10, one of the adjacent rotating blocks is provided with a coupling protruding portion having a protruding shape, the other is provided with a coupling recessed portion having a recessed shape, and each of the plurality of rotating blocks is coupled by fitting the coupling protruding portion and the coupling recessed portion.

In a display device according to Aspect 11, each of the recessed shape and the protruding shape has a shape corresponding to a portion of a polygonal shape having a same number of corners.

In a display device according to Aspect 12, the bending part is capable of bending with the display unit as an outer side.

Note that the disclosure is not limited to the embodiments stated above. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

1 Display device
2 EL display unit (display unit)
4 TFT layer
3 Inorganic barrier film
5 Light-emitting element layer
6 Sealing layer 7 Layered body
8, 11 Adhesive layer
9 Protection material
10 Support material
12 Resin layer
15 Semiconductor film
16 Gate insulating film
16, 18, 20 Inorganic insulating film
21 Flattening film
22 Anode electrode
23b Bank
23c Partition
24 EL layer
25 Cathode electrode
26 First inorganic sealing film
26, 28 Inorganic sealing film
27 Organic sealing film
28 Second inorganic sealing film
30 Housing
30(1) First support part
30(2) Second support part
32 Bending part
34 Rotating block
34(1) First rotating block
34(2) Second rotating block
35 Coupling hole
35(1) First coupling hole
35(2) Second coupling hole
36 Coupling pin
37 Rotation control pin
37(1) Rear portion of rotation control pin
37(2) Tip portion of rotation control pin
38 Rotation control hole
39 Function film
45 Coupling portion
45(1) First rotating block coupling protruding portion
45(2) Second rotating block coupling recessed portion
47 Bending regulating portion
50 Mother substrate

The invention claimed is:

1. A display device comprising:
    a display; and
    a housing,
    wherein the housing includes a plurality of support portions and a bending portion,
    at least two of the plurality of support portion are coupled via the bending portion,
    the display is fixed to the plurality of support portions,
    the bending portion is at least capable of bending with the display as an inner side,
    in a case where the display device is closed with the display as an inner side, a distance between opposing portions of the display is not less than a predetermined distance d,
    the bending portion includes a plurality of rotating blocks which are coupled, and each of the plurality of rotating blocks is a convex polygon with a cross-sectional shape having six or more corners in a cross-section;
    wherein a coupling hole used for coupling adjacent rotating blocks of the plurality of rotating blocks is provided in each of the plurality of rotating blocks, a coupling pin is inserted into the coupling hole,
    two of the adjacent rotating blocks share the coupling pin to couple the adjacent rotating blocks with each other,
    at least one of the adjacent rotating blocks is capable of rotating about the coupling pin
    the coupling hole is provided at two corners of each of the plurality of the rotating blocks, the two corners are not a corner closest to the display and a corner farthest from the display;
    wherein one of the adjacent rotating blocks is provided with a rotation control pin, the other is provided with a plurality of rotation control holes, and
    a bent state of the bending portion is selected and the bent state is maintained by the rotation control pin fitting into one of the plurality of rotation control holes.

2. The display device according to claim 1, wherein two of the coupling holes are provided in each of the plurality of rotating blocks, and an inter-holes distance L between the two of the coupling holes in one of the plurality of rotating blocks is one type or two types in the plurality of rotating blocks defining constituting the bending portion.

3. The display device according to claim 2,
    wherein in a case where a number of the plurality of rotating blocks provided between the two of the plurality of support portions is n,
    an average of the inter-holes distance L in n rotating blocks is La, and
    a distance between the displayer and the coupling hole is M,
    the distance d is $d=2(nLa/\pi-M)$.

4. The display device according to claim 1,
    wherein one of the adjacent rotating blocks is provided with a coupling protruding portion having a protruding shape,
    the other is provided with a coupling recessed portion having a recessed shape, and
    each of the plurality of rotating blocks is coupled by fitting the coupling protruding portion and the coupling recessed portion.

5. The display device according to claim 4,
    wherein each of the recessed shape and the protruding shape has a shape corresponding to a portion of a polygonal shape having a same number of corners.

6. The display device according to claim 1,
    wherein the bending portion is capable of bending with the display as an outer side.

7. The display device according to claim 1, wherein two of the coupling holes are provided in each of the plurality of rotating blocks, and as to a height of each of the plurality of the rotating blocks in a direction orthogonal to a virtual line connecting the two of coupling holes, a first height on one side of the virtual line and a second height on another side of the virtual line are different from each other.

8. The display device according to claim 7, wherein one of the first height and the second height which is closer to the display on the one side and the another side is smaller than another one of the first height and the second height which is farther from the display on the one side and the another side.

9. The display device according to claim 1,
    wherein each of the plurality of rotation blocks has a same cross-sectional shape.

* * * * *